United States Patent
Xiao

(10) Patent No.: US 8,092,641 B1
(45) Date of Patent: Jan. 10, 2012

(54) SYSTEM AND METHOD FOR REMOVING ORGANIC RESIDUE FROM A CHARGED PARTICLE BEAM SYSTEM

(75) Inventor: Hong Xiao, Milpitas, CA (US)

(73) Assignee: Hermes-Microvision, Inc., Hsinchu (TW)

( * ) Notice: Subject to any disclaimer, the term of this patent is extended or adjusted under 35 U.S.C. 154(b) by 1267 days.

(21) Appl. No.: 11/199,898

(22) Filed: Aug. 8, 2005

(51) Int. Cl.
*B08B 7/00* (2006.01)

(52) U.S. Cl. .................. 156/345.37; 250/492.2; 134/19; 134/22.18

(58) Field of Classification Search ............. 250/492.2, 250/492.21, 492.3; 134/2, 19, 39, 38, 37, 134/22.1, 22.18; 156/345.37, 345.33, 345.4
See application file for complete search history.

(56) References Cited

U.S. PATENT DOCUMENTS

| | | | | |
|---|---|---|---|---|
| 5,003,178 A * | 3/1991 | Livesay | .................... | 250/492.3 |
| 5,144,147 A * | 9/1992 | Shiozaki et al. | ........... | 250/492.2 |
| 5,312,519 A * | 5/1994 | Sakai et al. | ................ | 134/1.1 |
| 5,466,942 A * | 11/1995 | Sakai et al. | ................ | 250/492.2 |
| 5,539,211 A * | 7/1996 | Ohtoshi et al. | ........... | 250/441.11 |
| 5,633,506 A * | 5/1997 | Blake | ....................... | 250/492.21 |
| 5,981,960 A * | 11/1999 | Ooaeh et al. | ............... | 250/492.2 |
| 6,192,897 B1 * | 2/2001 | Klebanoff et al. | ............ | 134/1.1 |
| 6,394,109 B1 * | 5/2002 | Somekh | ........................ | 134/39 |
| 6,772,776 B2 * | 8/2004 | Klebanoff et al. | ............ | 134/1.3 |
| 7,173,260 B2 * | 2/2007 | Anc et al. | .................. | 250/492.1 |
| 2004/0159638 A1 * | 8/2004 | Demos et al. | ............ | 219/121.35 |

* cited by examiner

*Primary Examiner* — Alexander Markoff
(74) *Attorney, Agent, or Firm* — Sawyer Law Group, P.C.

(57) ABSTRACT

A system and method for removing an organic residue from a charged particle beam system includes a conduit that is coupled to the column and is for adding oxygen to the column. A heater is coupled to the column and is for increasing the temperature in the column. A pump is coupled to the column and is for removing a gas from the chamber, wherein the gas is a byproduct of a chemical reaction of the organic residue and the oxygen.

10 Claims, 7 Drawing Sheets

SYSTEM AND METHOD FOR REMOVING ORGANIC RESIDUE FROM A CHARGED PARTICLE BEAM SYSTEM

FIELD OF THE INVENTION

The present invention relates to particle beam systems, and more particularly to a system and method for removing organic residue from a charged particle beam system.

BACKGROUND OF THE INVENTION

Charged particle beam systems include electron and ion beam systems. A beam column is located inside a sealed chamber and includes a charged particle source, lens and deflectors. The charged particle beam passes the lens and deflectors and strikes a sample. Inside the chamber are parts that include organic materials, for example the insulating cover of electrical wires. The covers include carbon and hydrogen, which over time outgas into the vacuum environment of the sealed chamber and cause organic residue, or deposits, on the surface of the column. Additionally, the sample may have organic compounds, for example photoresist that may outgas during charged particle beam bombardment.

Organic residue can cause charging and adversely affect the function of the charged particle beam system. Accordingly, what is needed is a system and method for removing organic residue from a charged particle beam system. The present invention addresses such a need.

BRIEF SUMMARY OF THE INVENTION

The present invention provides a system and method for removing an organic residue from a charged particle beam system. The system includes a conduit that is coupled to the column and is for adding oxygen to the column. A heater is coupled to the column and is for increasing the temperature in the column. A pump is coupled to the column and is for removing a gas from the chamber, wherein the gas is a byproduct of a chemical reaction of the organic residue and the oxygen.

In one embodiment, the oxygen is in the form of ozone, which dissociates more rapidly in a heated environment. The ozone dissociates into stable oxygen molecules and oxygen free radicals, so that the radicals react with the carbon and hydrogen of the organic residue. The gas resulting from the reaction may be pumped out after sufficient bonding has occurred, removing organic residue from the charged particle beam system.

DETAILED DESCRIPTION OF THE INVENTION

The present invention relates to a system and method for removing organic residue from a charged particle beam system. The following description is presented to enable one of ordinary skill in the art to make and use the invention and is provided in the context of a patent application and its requirements. Various modifications to the preferred embodiments and the generic principles and features described herein will be readily apparent to those skilled in the art. Thus, the present invention is not intended to be limited to the embodiments shown, but is to be accorded the widest scope consistent with the principles and features described herein.

Figure 1:
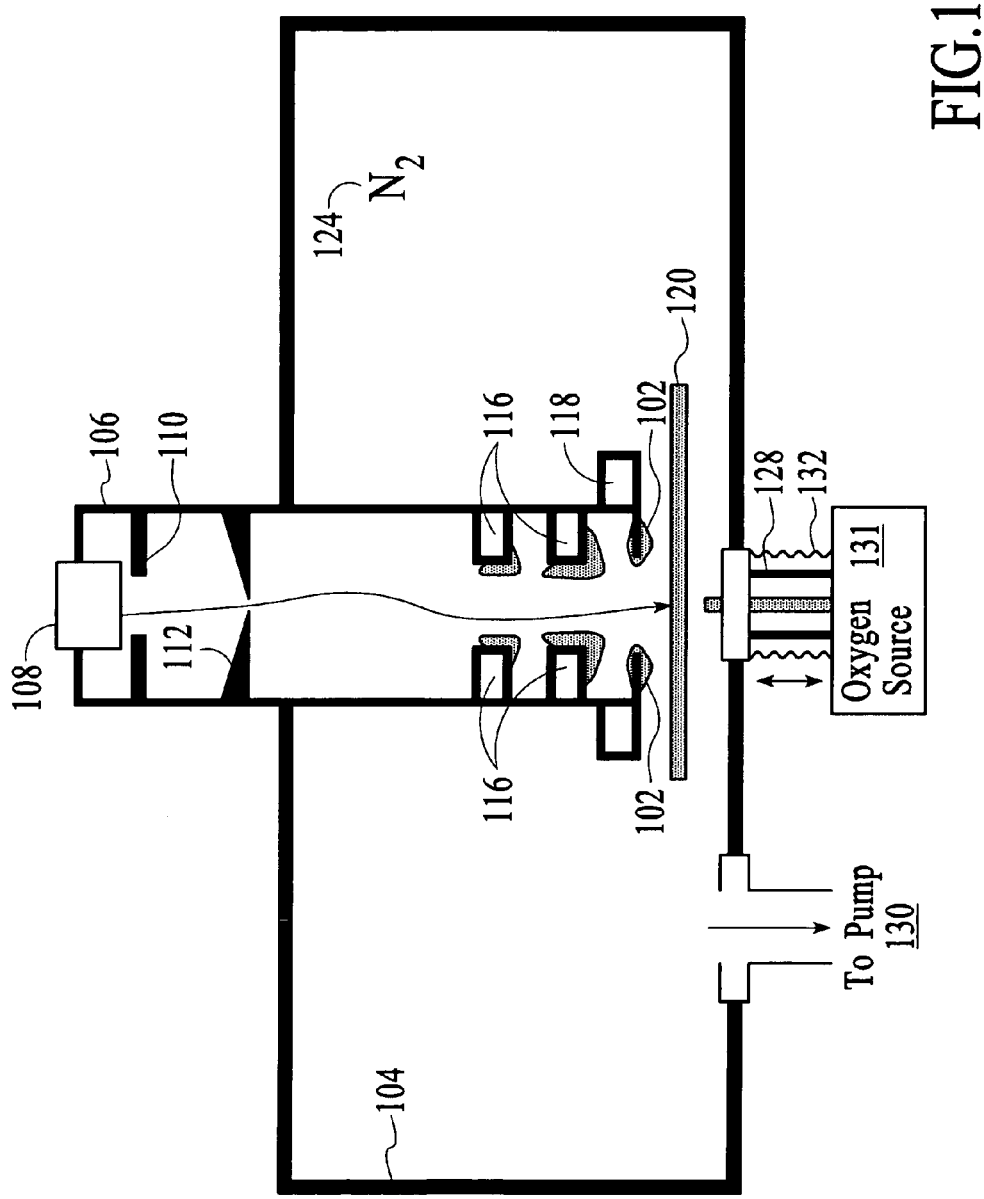
FIG. 1 is a diagram of a charged particle beam system with organic residue.

FIG. 1 is a diagram of a charged particle beam system 100 with an organic residue 102. The charged particle beam system 100 includes a chamber 104 housing a beam column 106. A beam source 108 is mounted in the column 106, generating for example electron or ion beams. A gate valve 110 and aperture 112 control and guide the release of a charged particle beam 114 from the beam source 108. The chamber 104 and column 106 are typically in a vacuum state, at less than atmospheric pressure.

The beam 114 travels down the column 106 and is directed by deflectors 116 and lens 118 onto a sample 120, which may be a silicon wafer, for example. Over time, organic parts (not shown) inside the chamber 104 release gases that end up as the organic residue 102 on deflectors 116, lens 118 and other column surfaces. Additionally, other sources may release gases ending up with the organic residue 102, for example a photoresist on a silicon wafer may outgas during charged particle beam bombardment. The organic residue 102 has some effect on the beam 114 as it travels, and emissions from the organic residue 102 may affect readings by a detector (not shown) and degrade the measurement or inspection process. One of ordinary skill in the art will recognize that other elements of the system 100 are not displayed in FIG. 1 in order to more closely focus on the present invention.

In one embodiment of the invention, an organic residue cleaning system 122 removes the organic residue 102 from the system 100. The cleaning system 122 includes a heater 126, a conduit 128, a pump 130 and an oxygen source 131. The oxygen source may be an ozone or downstream plasma generator, of example. FIGS. 2-6 will illustrate the operation of the cleaning system 122.

Figure 2:
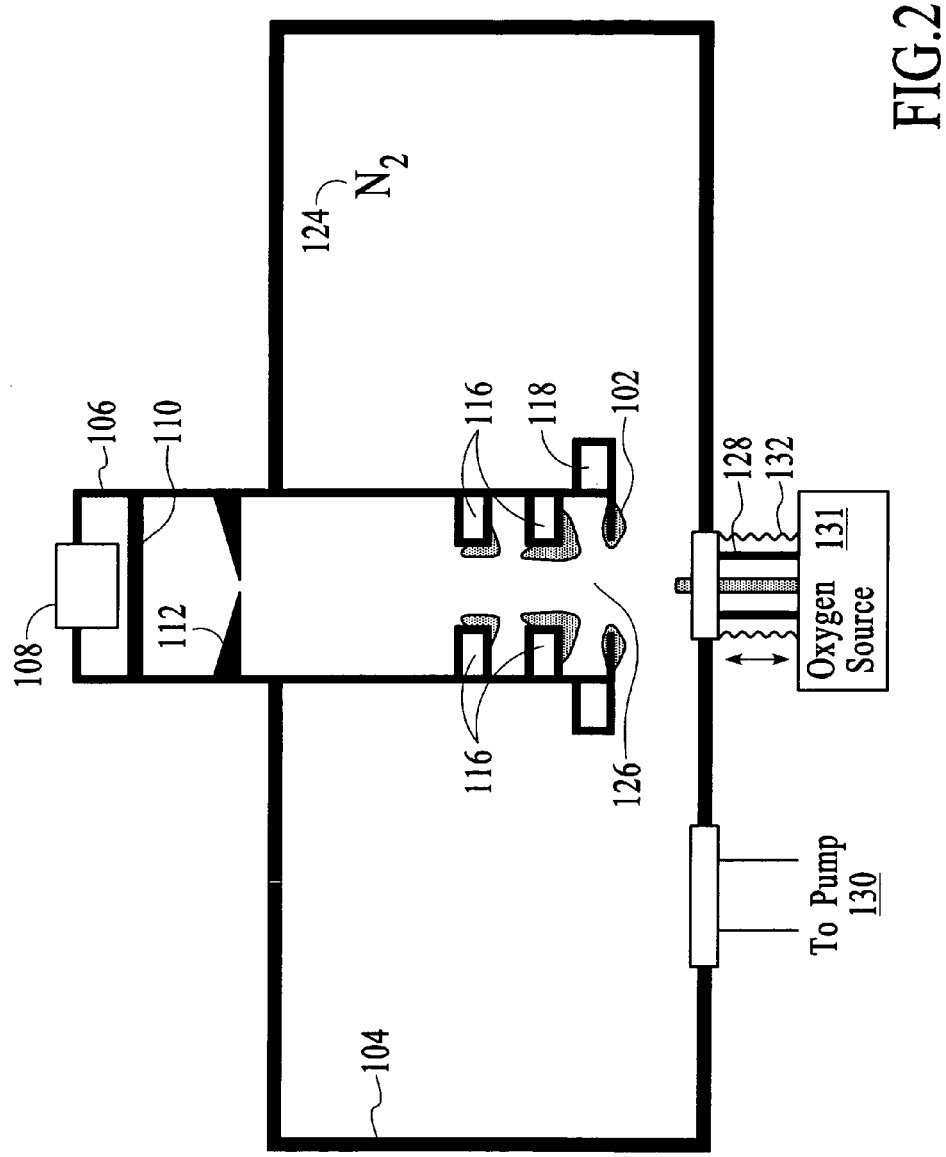
FIG. 2 is a diagram of one embodiment of a system for removing organic residue from the charged particle beam system of FIG. 1.

FIG. 2 is a diagram of one embodiment of the system for removing organic residue 102 from the charged particle beam system 100 of FIG. 1. The beam source 108 is no longer operating and the gate valve 110 is closed when the sample 120 (see FIG. 1) is removed. The pressure in the chamber 104 is raised by injecting a gas 124, for example $N_2$, into the chamber 104. The pressure in the chamber 104 may be raised to anywhere from 20-200 mTorr. The gas 124 may be injected by a variety of sources.

Figure 3:
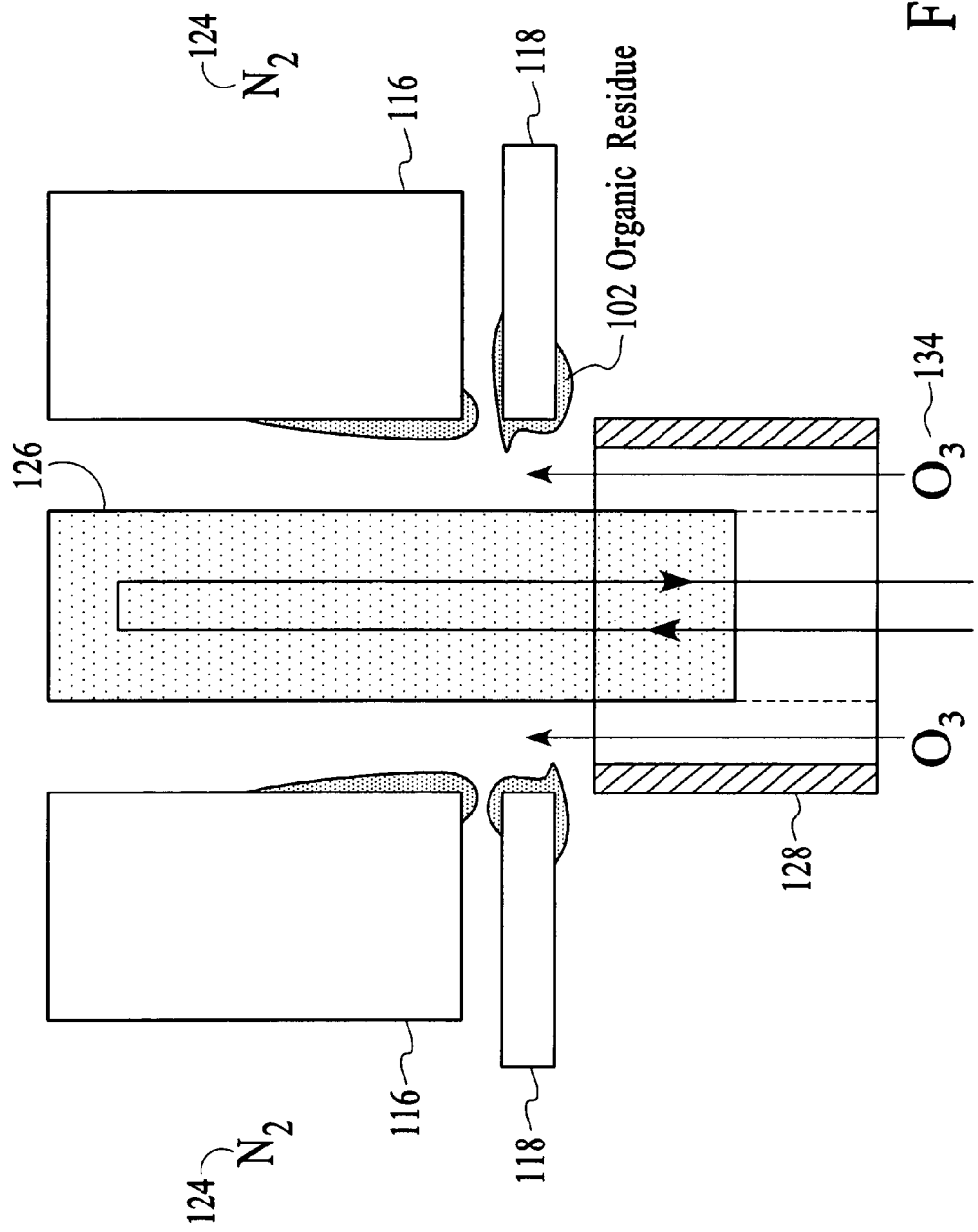
FIG. 3 is a more detailed diagram of one embodiment of the system for removing organic residue from FIG. 2.

In one embodiment, a heater 126 is coupled to the chamber 104 and is extended into the column 106. A bellow 132 may assist in sealing the chamber 104. In another embodiment, the heater 126 may be fixed or may be extended from another location. FIG. 3 will illustrate the heater 126, the conduit 128 and their operation in more detail.

FIG. 3 is a more detailed diagram of one embodiment of part of the system 122 for removing organic residue from FIG. 2. The heater 126 is positioned in close proximity to the deflectors 116 and the lens 118. The heater 126 is activated and may heat the immediate area, for example to a temperature of 100-300° C. The oxygen 134 from the oxygen source 131 is passed through conduit 128 into the heated area nearby the organic residue 102. Heating of the oxygen 134 may begin before the oxygen 134 reaches the chamber 104, for example by extending the heater 126 or another heater to conduit 128. The oxygen may take different forms, for example $O_3$ (ozone), O (an oxygen free radical), etc. An $O_2$ discharge that generates O in plasma in a vacuum may be used, or a downstream $O_2$ plasma that generates O and mixes it with $O_2$ to the chamber 104. In the above embodiment, ozone breaking into $O_2$ and O through thermal decomposition is discussed.

Figure 4:
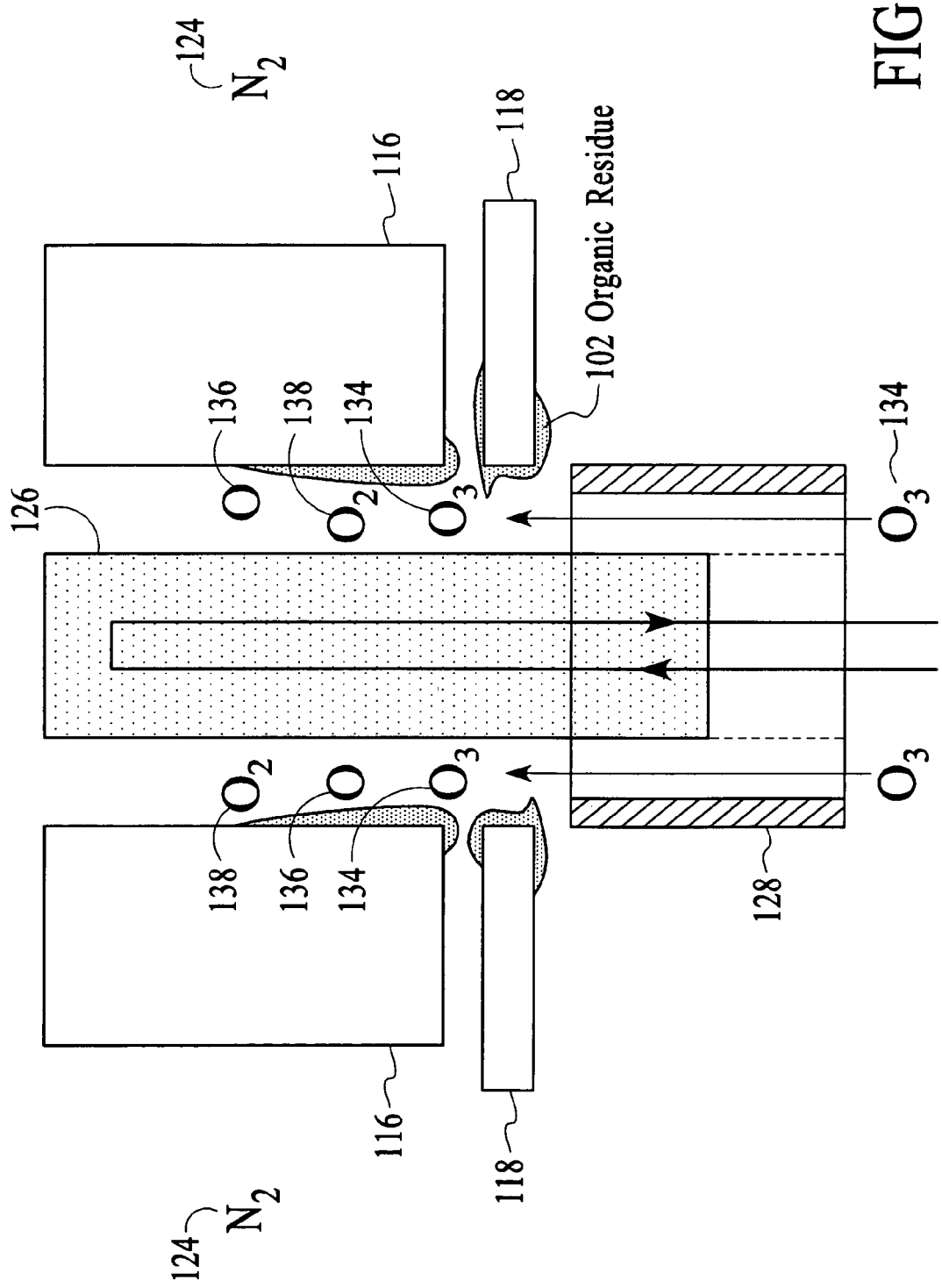
FIG. 4 is a diagram of the system from FIG. 3 with oxygen dissociating.

The $O_3$ 134 enters the heated area nearby the deflector 116 and the lens 118 as exits the conduit 128. As an unstable gas, ozone has a half-life of about 45 minutes at room temperature. The increased temperature speeds the decomposition to O and $O_2$. FIG. 4 illustrates the breakdown of the ozone.

Figure 5:
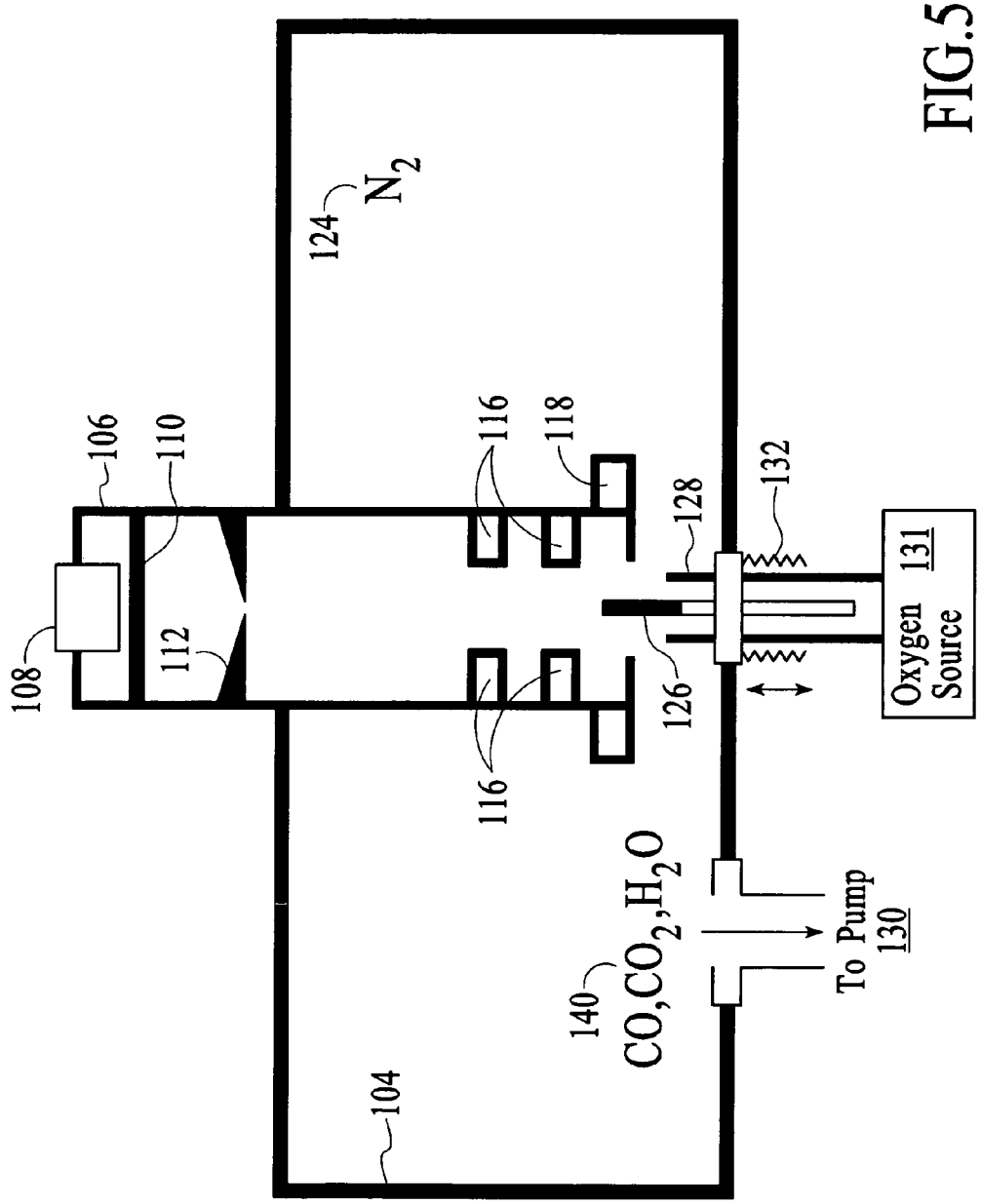
FIG. 5 is a diagram of one embodiment of a system for removing organic residue once the oxygen and the organic residue form a gas.

FIG. 4 is a diagram of the system 122 from FIG. 2 with ozone dissociating. The gas 134 dissociates into O 136 and $O_2$ 138. The increased pressure in the chamber 104 (see FIG. 1) keeps more of the O 136 nearby the organic residue 102. The proximity of the heater 126 to the organic residue 102 is related to the temperature at which the area is heated. The higher the temperature, the more rapid the dissociation and the closer the proximity the ozone release should be to the organic residue. If the O 136 spreads throughout chamber 104, parts with organic material (not shown) will oxidize, an undesirable effect. With lower temperature, a greater distance is possible but then a greater expansion of the gas 134 may be expected. The pressure in the chamber 104 may be arranged so that the mean free path of O 136 is approximately the distance between the heater 126 and the organic residue 102 (or column surface). The chamber surface may be gold plated for protection from the O 136. FIG. 5 returns to a larger system diagram illustrating the gas by-product.

Figure 6:
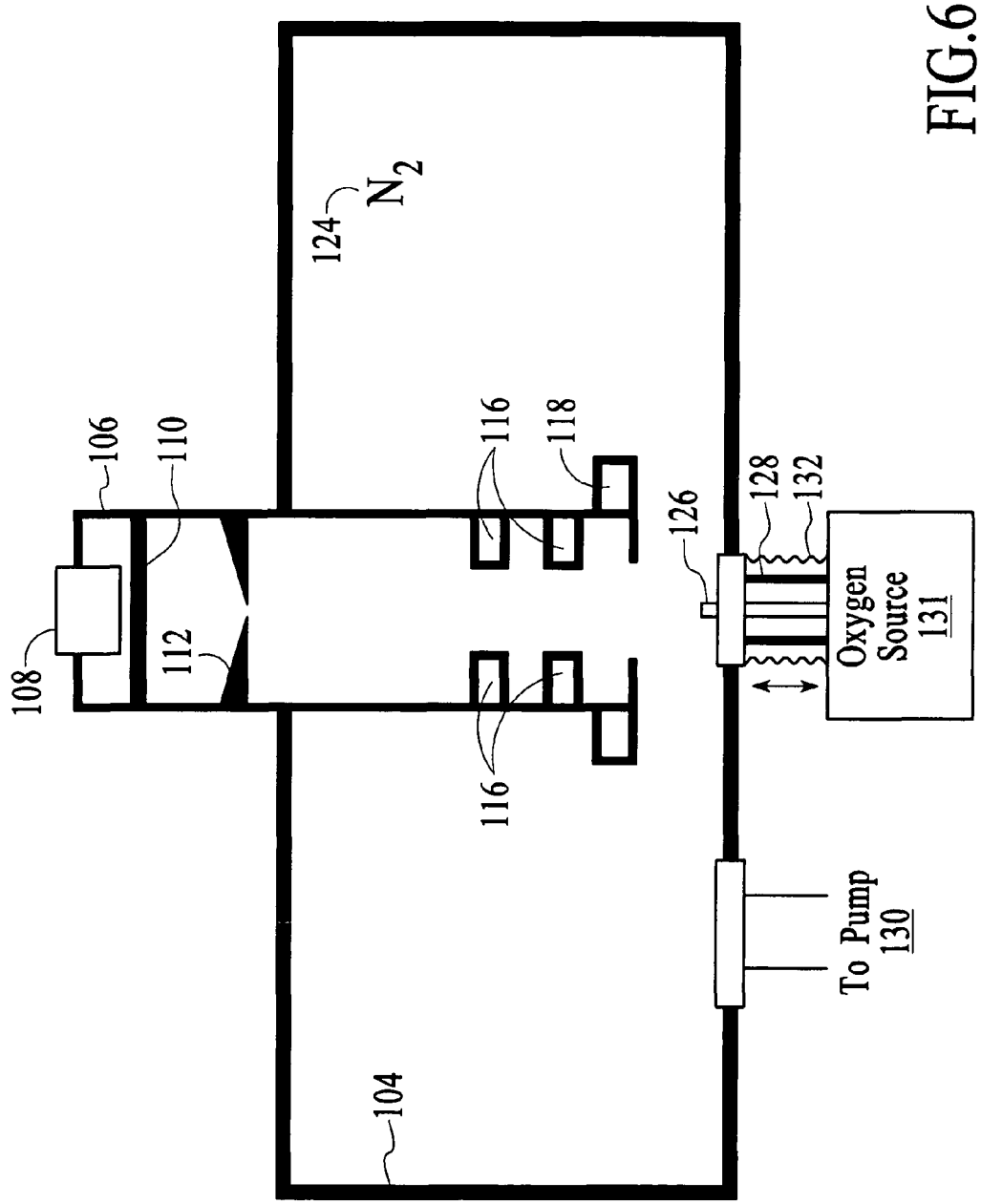
FIG. 6 is a diagram of one embodiment of the system retracted from the charged particle beam system after removal of the gas.

FIG. 5 is a diagram of one embodiment of a system for removing organic residue once the O 136 and the organic residue 102 react and form a gas. If the organic residue is comprised of carbon (C) and hydrogen (H), then the resulting gas may include CO, $CO_2$, and $H_2O$, for example. The organic residue 102 may be partly or wholly gone, depending on the amount of time that passes, the temperature, and the amount of ozone injected into the chamber 104. In one embodiment, ten minutes may be an appropriate amount of time for the majority of the organic residue 102 to bond with the O 136 to form the gas 140. FIG. 6 illustrates the results of the final steps.

FIG. 6 is a diagram of one embodiment of the system 122 retracted from the charged particle beam system 100 after removal of the gas 140. The pump 130 removes the gas 140 from the chamber 104 and returns the chamber 104 to the appropriate level of vacuum. In another embodiment, the pump 130 is remotely located rather than directly connected to the chamber 104. The heater 128 is retracted back to the position illustrated in FIG. 1 and there is room for another sample.

Figure 7:
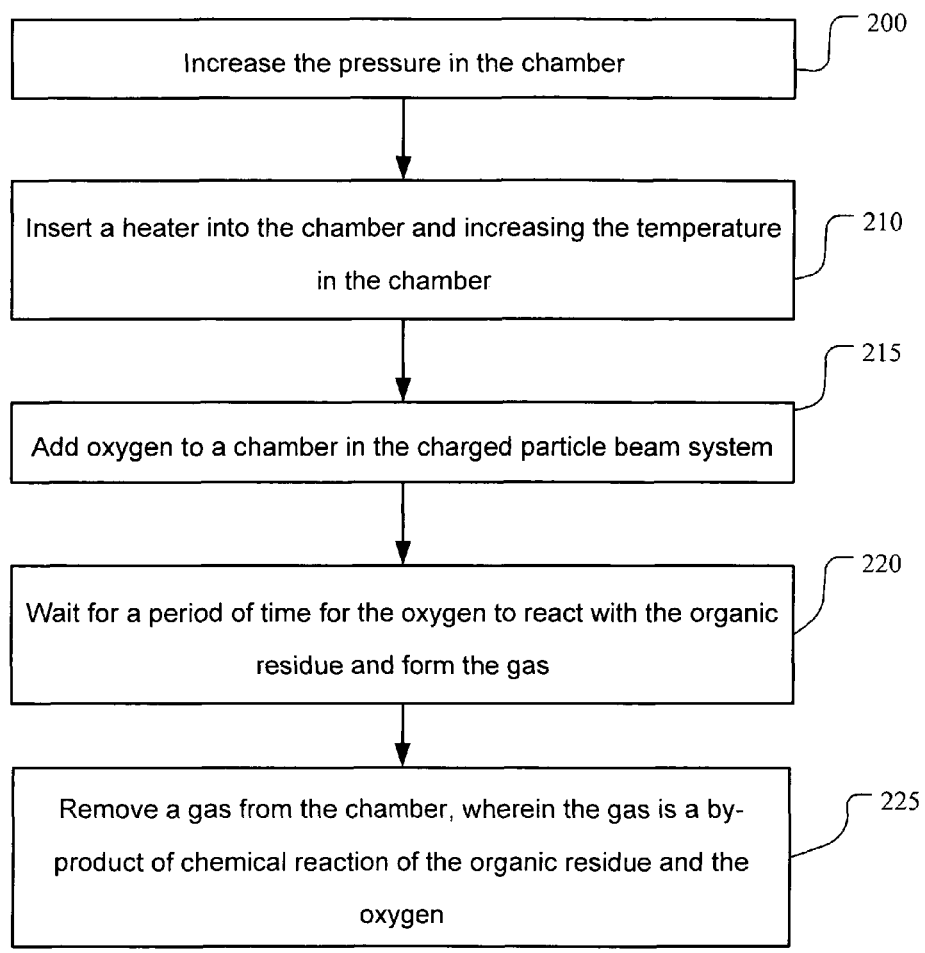
FIG. 7 is a flow diagram illustrating one method of removing organic residue from a charged particle beam system.

FIG. 7 is a flow diagram illustrating one method of removing organic residue from a charged particle beam system. FIG. 7 will be discussed in conjunction with FIG. 1. In block 200, the pressure in the chamber 104 is increased, for example by adding $N_2$. In block 210, a heater 128 is inserted into the chamber 104 and the temperature is increased. In block 215, oxygen is added to the chamber 104, for example in the form of ozone. In block 220, a period of time passes while the oxygen dissociates into free radical oxygen and reacts with the organic residue to form a gas. In block 225, the gas is removed from the chamber 104, where the gas is at least in part a combination of the free radical oxygen and the organic residue, and may include the gas used to increase the pressure in the chamber 104 from block 200.

According to the method and system disclosed herein, the present invention provides a system and method for removing organic residue from a charged particle beam system. The present invention has been described in accordance with the embodiments shown, and one of ordinary skill in the art will readily recognize that there could be variations to the embodiments, and any variations would be within the spirit and scope of the present invention. Accordingly, many modifications may be made by one of ordinary skill in the art without departing from the spirit and scope of the appended claims.

I claim:

1. An apparatus for removing an organic residue from a particle beam system comprising:
    a conduit, coupled to a column of the charged particle beam system inside a chamber, for adding oxygen to react with the organic residue on a surface of a lens and a deflector inside the column, wherein a charged particle beam from a beam source travels down the column and is focused by the deflector and lens;
    at least one deflector coupled to the column:
    a heater, inside said conduit, being extended into the column and in close proximity to the lens and the deflector, said heater for heating the organic residue; and
    a pump, coupled to the chamber column, for pumping removing a gas from a the chamber, wherein the gas is a byproduct of a chemical reaction of the organic residue and the oxygen.

2. The system of claim 1, wherein the heater is positionable near the organic residue.

3. The system of claim 1, the conduit further for increasing pressure in the chamber with nitrogen.

4. The system of claim 1, the conduit mounted near the heater for directing the oxygen to an area of increased temperature.

5. The system of claim 3, the oxygen being ozone, wherein the ozone dissociates into a stable oxygen molecule and an oxygen free radical in the area of increased temperature, the oxygen free radical bonding with the organic residue to form the gas.

6. A charged particle beam system comprising:
    a column including a charged particle source, a lens and deflectors, wherein a charged particle beam is directed by the lens and the deflectors and strikes on a sample;
    at least one deflector and a lens coupled to the column;
    a conduit coupled to and below the column for adding oxygen to react with an organic residue on surfaces of the lens and deflectors;
    a heater, inside the conduit, being extended into the column and close to proximity to the lens and deflectors, said heater for increasing the temperature to the organic residue; and
    a pump for removing a gas from a chamber, said column being inside the chamber, wherein the gas is a byproduct of a chemical reaction of the organic residue and the oxygen.

7. The charged particle beam system of claim 6, the heater retractably coupled to the column, wherein the heater is positionable near the lens and the deflector.

8. The charged particle beam system of claim 6, the conduit further for increasing pressure in the chamber with nitrogen.

9. The charged particle beam system of claim 6, the conduit mounted near the heater for directing the oxygen to an area of increased temperature.

10. The charged particle beam system of claim 6, the oxygen being ozone, wherein the ozone dissociates into a stable oxygen molecule and an oxygen free radical in the area of increased temperature, the oxygen free radical bonding with the organic residue to form the gas.

\* \* \* \* \*